United States Patent
Hsu

(10) Patent No.: US 10,312,648 B2
(45) Date of Patent: Jun. 4, 2019

(54) OUTLET DEVICE

(71) Applicant: POWERTECH INDUSTRIAL CO., LTD., New Taipei (TW)

(72) Inventor: Jung-Hui Hsu, New Taipei (TW)

(73) Assignee: POWERTECH INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 15/792,849

(22) Filed: Oct. 25, 2017

(65) Prior Publication Data

US 2018/0115109 A1 Apr. 26, 2018

(30) Foreign Application Priority Data

Oct. 26, 2016 (TW) .............................. 105134550 A

(51) Int. Cl.
| | |
|---|---|
| *H01R 13/73* | (2006.01) |
| *H01R 25/00* | (2006.01) |
| *H01R 24/66* | (2011.01) |
| *H02G 3/08* | (2006.01) |
| *G05B 13/02* | (2006.01) |
| *G10L 15/22* | (2006.01) |

(Continued)

(52) U.S. Cl.
CPC ........... *H01R 25/006* (2013.01); *G05B 13/02* (2013.01); *G10L 15/22* (2013.01); *H01R 13/6395* (2013.01); *H01R 13/6675* (2013.01); *H01R 13/6683* (2013.01); *H01R 13/73* (2013.01); *H01R 24/66* (2013.01); *H01R 24/76* (2013.01); *H01R 25/003* (2013.01); *H01R 35/02* (2013.01); *H02G 3/081* (2013.01); *H05K 7/20145* (2013.01); *G10L 2015/223* (2013.01); *H01R 13/70* (2013.01); *H01R 24/62* (2013.01); *H01R 2103/00* (2013.01); *H02G 3/18* (2013.01)

(58) Field of Classification Search
CPC .... H01R 13/6395; H01R 13/73; H01R 24/76; H01R 33/00
USPC .... 439/535–539, 540.1, 638, 577, 651, 574; 174/481
See application file for complete search history.

(56) References Cited

U.S. PATENT DOCUMENTS 4,867,701 A * 9/1989 Wiand ................. H01R 25/006
248/205.3
6,004,157 A * 12/1999 Glass ..................... A47B 21/06
439/535

(Continued)

*Primary Examiner* — Edwin A. Leon
*Assistant Examiner* — Milagros Jeancharles
(74) *Attorney, Agent, or Firm* — Li & Cai Intellectual Property (USA) Office

(57) ABSTRACT

An outlet device includes a counterweight portion, a hanging portion arranged distant from the counterweight portion, an extending portion having two ends respectively connected to the counterweight portion and the hanging portion, a blowing unit, and a power cord connected to the counterweight portion. The outlet unit of the counterweight portion and the blowing unit are electrically connected to the power cord. The blowing unit is installed on the counterweight portion, the hanging portion, or the extending portion for inhaling external air into the airflow channel and blowing airflow to the air exit. When the outlet device is applied to a plate, the counterweight portion is arranged under the plate and the hanging portion is arranged on the plate, and the hanging portion remains hung on the plate by using the weight distribution of the outlet device, thereby maintaining the outlet device in a static balance state.

9 Claims, 17 Drawing Sheets

(51) Int. Cl.
  *H01R 13/639*   (2006.01)
  *H01R 13/66*    (2006.01)
  *H01R 24/76*    (2011.01)
  *H01R 35/02*    (2006.01)
  *H05K 7/20*     (2006.01)
  *H01R 103/00*       (2006.01)
  *H02G 3/18*         (2006.01)
  *H01R 13/70*        (2006.01)
  *H01R 24/62*        (2011.01)

(56) References Cited

U.S. PATENT DOCUMENTS

| | | | | |
|---|---|---|---|---|
| 6,379,182 B1 * | 4/2002 | Byrne | H01R 13/73 | 439/574 |
| 6,540,554 B2 * | 4/2003 | McCarthy | H01R 13/73 | 439/574 |
| 6,653,562 B2 * | 11/2003 | Kochanski | H01R 13/72 | 174/480 |
| 7,083,421 B1 * | 8/2006 | Mori | H01R 13/46 | 439/574 |
| 7,154,402 B2 * | 12/2006 | Dayoub | G08B 17/10 | 340/628 |
| 7,358,625 B2 * | 4/2008 | Cheng | H01R 13/6675 | 307/18 |
| 7,656,664 B2 * | 2/2010 | Ye | H05K 7/20154 | 361/691 |
| 7,734,038 B2 * | 6/2010 | Martich | H01R 13/73 | 174/50 |
| 7,795,533 B2 * | 9/2010 | Bravo | H02G 3/16 | 174/50 |
| 7,938,679 B2 * | 5/2011 | Wadsworth | H01R 13/74 | 439/574 |
| 8,469,748 B2 * | 6/2013 | Chambers | H01R 13/005 | 439/577 |
| 8,920,191 B2 * | 12/2014 | Carpanzano | H01R 13/74 | 439/491 |
| 8,941,976 B1 * | 1/2015 | Maroney | H04B 3/56 | 340/855.9 |
| 9,013,880 B2 * | 4/2015 | Lai | G06F 1/18 | 200/341 |
| 9,543,692 B2 * | 1/2017 | Shomali | H01R 13/5224 | |
| 9,804,652 B2 * | 10/2017 | Volek | G06F 1/266 | |
| 2008/0158765 A1 * | 7/2008 | Hsu | H01R 13/6666 | 361/118 |
| 2010/0033990 A1 * | 2/2010 | Chien | F21S 8/035 | 362/641 |
| 2012/0028505 A1 * | 2/2012 | Weber | H01R 25/003 | 439/638 |
| 2013/0330961 A1 * | 12/2013 | Peng | H05K 5/0017 | 439/485 |
| 2016/0294127 A1 * | 10/2016 | Mouradian | H01R 13/72 | |
| 2017/0290195 A1 * | 10/2017 | Jansen | H05K 7/20136 | |

* cited by examiner

OUTLET DEVICE

BACKGROUND OF THE INVENTION

1. Field of the Invention

The present disclosure relates to an outlet; in particular, to an outlet device for hanging on a plate.

2. Description of Related Art

The structure of a conventional outlet device has not undergone any significant change in recent years, thus limiting the functions thereof. For example, when the conventional outlet device is applied to a desk, the conventional outlet device does not have any additional function other than the function of supplying power.

SUMMARY OF THE INVENTION

The present disclosure provides an outlet device to solve the drawback associated with conventional outlet devices.

The present disclosure provides an outlet device for being hung on a plate, in which the outlet device includes a counterweight portion, a hanging portion, an extending portion, a blowing unit, and a power cord. The counterweight portion includes an outlet unit. The hanging portion is arranged distant from the counterweight portion. The extending portion has two opposite ends respectively connected to the counterweight portion and the hanging portion. The extending portion, the hanging portion, and the counterweight portion are formed with an airflow channel, an air exit, and an air entrance. The air exit and the air entrance are in air communication with the airflow channel. A free end of the hanging portion is arranged distant from the extending portion by a lateral distance, the extending portion has a width parallel to the lateral distance, and the width is less than or equal to the lateral distance. The blowing unit is corresponding in position to the air entrance. The blowing unit is configured to inhale external air into the extending portion and blow airflow to the air exit through the airflow channel. The power cord is electrically connected to the outlet unit and the blowing unit. The power cord has an end connected to the counterweight portion and an opposite end used for detachably inserting into an external power supplying outlet. When the outlet device is applied to the plate, the counterweight portion is arranged under the plate and the hanging portion is arranged on the plate, and the hanging portion remains hung on the plate by using the weight distribution of the outlet device, thereby maintaining the outlet device in a static balance state.

The present disclosure also provides an outlet device, which includes a counterweight portion, a hanging portion, an extending portion, and a blowing unit. The hanging portion is arranged distant from the counterweight portion. At least one of the counterweight portion and the hanging portion is provided with an outlet unit. The extending portion has two opposite ends respectively connected to the counterweight portion and the hanging portion. The extending portion, the hanging portion, and the counterweight portion are formed with an airflow channel and an air exit in air communication with the airflow channel. The blowing unit is arranged in the airflow channel. The blowing unit is configured to inhale external air into the airflow channel and blow airflow to the air exit.

In summary, the outlet device of the present disclosure is provided with the blowing unit, and the inner space of the outlet device can be utilized to form the airflow channel, so that the value added for the outlet device can be increased.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Figure 1:
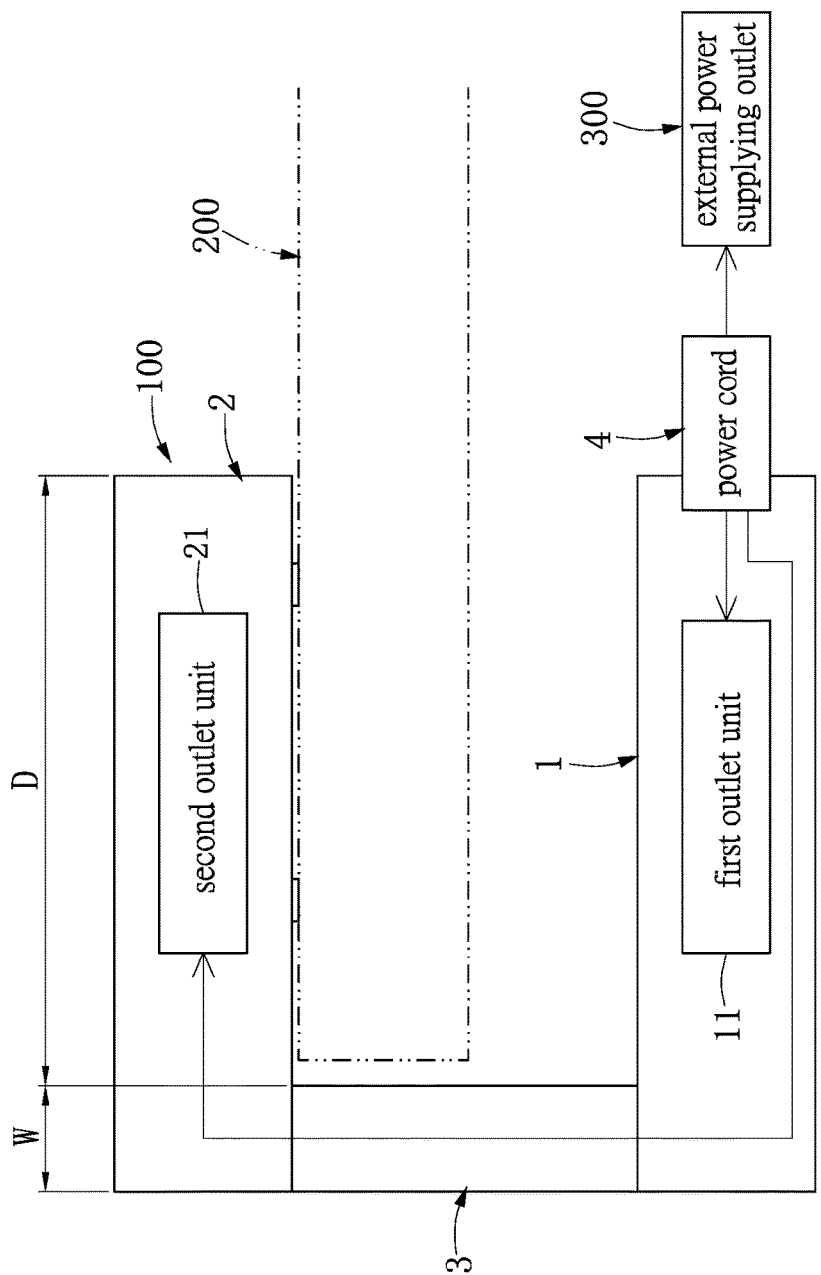
FIG. 1 is a schematic view showing an outlet device hanging on a plate and electrically connected to a power supplying outlet according to the present disclosure.

Reference is made to FIGS. 1 to 16. FIG. 1 illustrates a schematic view of the present disclosure, and FIGS. 2 to 16 illustrate six embodiments of the present disclosure. References are hereunder made to the detailed descriptions and appended drawings in connection with the present disclosure. However, the appended drawings are merely provided for exemplary purposes, and should not be construed as restricting the scope of the present disclosure.

As shown in FIG. 1, the present disclosure provides an outlet device 100 for being hung on a plate 200 (e.g., a desk, an office table, or a counter), but the present disclosure is not limited thereto. The outlet device 100 includes a counterweight portion 1, a hanging portion 2 arranged distant from the counterweight portion 1, an extending portion 3 connected to the counterweight portion 1 and the hanging portion 2, and a power cord 4 connected to the counterweight portion 1.

Specifically, the extending portion 3 has two opposite ends (i.e., the bottom end and the top end of the extending portion 3 as shown in FIG. 1) respectively connected to the counterweight portion 1 and the hanging portion 2. The connection of the extending portion 3 and the counterweight portion 1 (or the hanging portion 2) can be, but is not limited to, an integral connection, a detachable connection, a slidable connection, or a rotatable connection.

Moreover, the counterweight portion 1 includes a first outlet unit 11, and the hanging portion 2 includes a second outlet unit 21. The outlet device 100 is configured to hang on the plate 200 by adjusting the weight distribution of the counterweight portion 1, the hanging portion 2, and the extending portion 3. The outlet device 100 can be firmly hung on the plate 200 by adjusting the size proportion of the hanging portion 2 and the extending portion 3. For example, a free end of the hanging portion 2 (i.e., the right end of the hanging portion 2 as shown in FIG. 1) is arranged distant from the extending portion 3 by a lateral distance D, the extending portion 3 has a width W parallel to the lateral distance D, and the width W is less than or equal to the lateral distance D.

The power cord 4 has an end connected to the counterweight portion 1 and an opposite end used for detachably inserting into an external power supplying outlet 300. The power cord 4 is electrically connected to the first outlet unit 11 and the second outlet unit 21, thereby transmitting power from the external power supplying outlet 300 to the first outlet unit 11 and the second outlet unit 21. The connection of the power cord 4 and the counterweight portion 1 can be, but is not limited to, a fixed connection, a detachable connection, or a rotatable connection.

Accordingly, the outlet device 100 is configured to arrange the counterweight portion 1 under the plate 200 and to arrange the hanging portion 2 on the plate 200, and the hanging portion 2 remains hung on the plate 200 by using the weight distribution of the outlet device 100, thereby maintaining the outlet device 100 in a static balance state. Thus, the outlet device 100 of the present disclosure can satisfy a condition where an outlet under the plate 200 and an outlet on the plate 200 are needed at the same time by disposing the hanging portion 2 on the plate 200 to provide the first outlet unit 11 under the plate 200 and the second outlet unit 21 above the plate 200.

The common features of the outlet device 100 of the present disclosure have been disclosed in the above description, and a designer can use the above common features to form different embodiments of the outlet device 100. However, since the present disclosure cannot disclose all possible embodiments of the outlet device 100, the following description only describes some embodiments of the outlet device 100, but the present disclosure is not limited thereto.

First Embodiment

Figure 2:
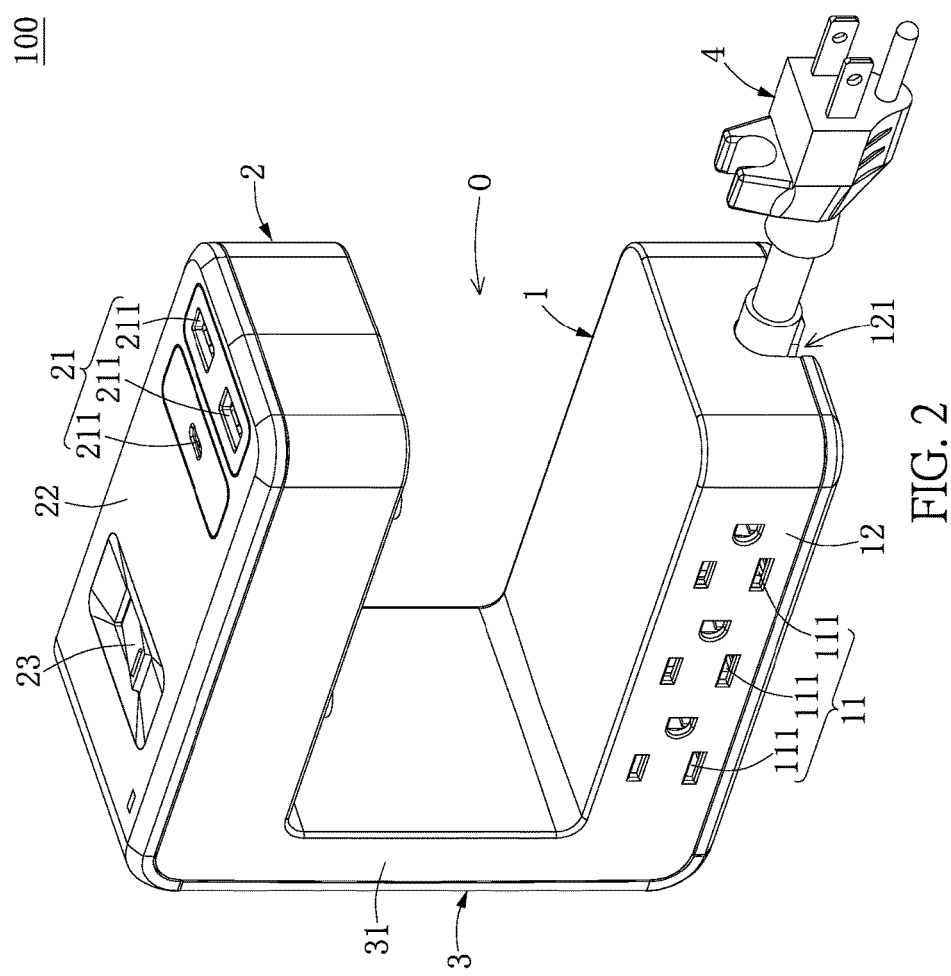
FIG. 2 is a perspective view showing the outlet device according to a first embodiment of the present disclosure.
Figure 3:
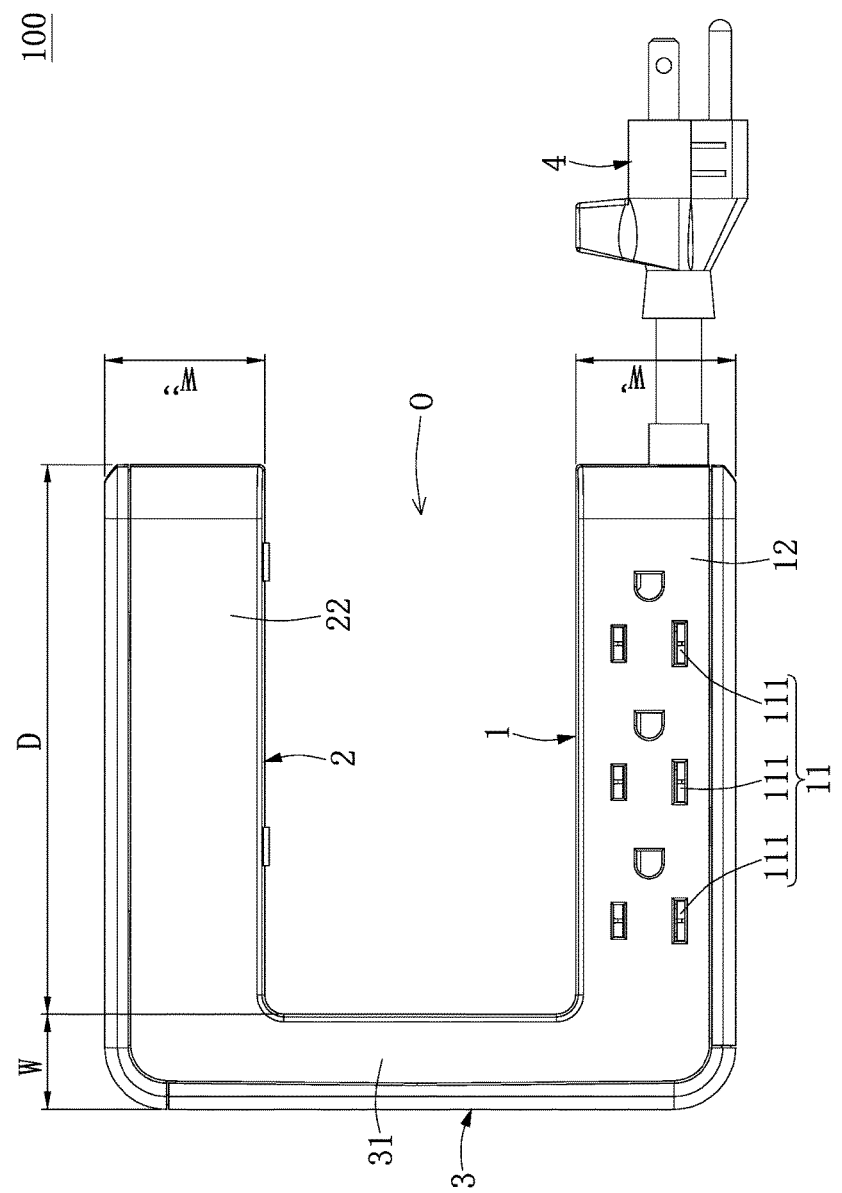
FIG. 3 is a planar view of FIG. 2.
Figure 4:
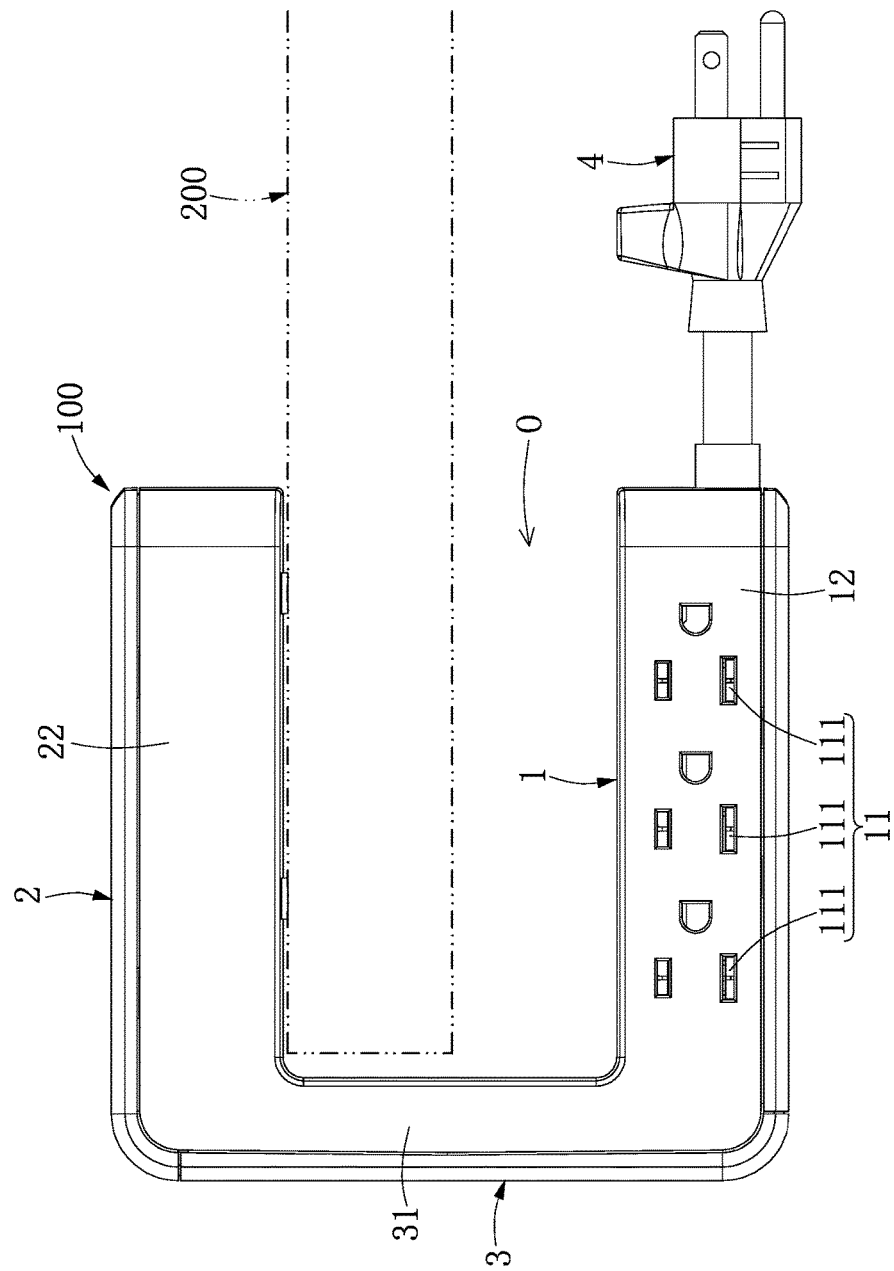
FIG. 4 is a planar view showing the outlet device of FIG. 2 hanging on a plate.

Reference is made to FIGS. 2 to 4, which illustrate a first embodiment of the present disclosure. The difference between the first embodiment and the above common features is disclosed as follows.

The counterweight portion 1 includes a first case 12, and the first outlet unit 11 is disposed in the first case 12. In other words, the first case 12 and the components arranged in the first case 12 in the present embodiment are co-defined as the counterweight portion 1. The first outlet unit 11 includes at least one AC power outlet 111, and an opening of the at least one AC power outlet 111 is arranged on a surface of the counterweight portion 1 (i.e., a side surface of the first case 12 as shown in FIG. 2) which does not face the hanging portion 2, but the present disclosure is not limited thereto.

The hanging portion 2 includes a second case 22, and the second outlet unit 21 is disposed in the second case 22. In other words, the second case 22 and the components arranged in the second case 22 in the present embodiment are co-defined as the hanging portion 2. The second outlet unit 21 includes at least one DC power outlet 211 (i.e., a USB outlet), and an opening of the at least one DC power outlet 211 is formed on a surface of the hanging portion 2 (i.e., a top surface of the second case 22 as shown in FIG. 2) which is arranged distant from the counterweight portion 1, but the present disclosure is not limited thereto.

Moreover, the hanging portion 2 in the present embodiment further includes a switch unit 23 for controlling the second outlet unit 21 and/or the first outlet unit 11 to supply electricity. The switch unit 23 is disposed on the surface of the hanging portion 2 (i.e., the top surface of the second case 22 as shown in FIG. 2) which is arranged distant from the counterweight portion 1, so that a user can conveniently operate the switch unit 23.

The extending portion 3 includes a third case 31. The third case 31 and the components arranged in the third case 31 in the present embodiment are co-defined as the extending portion 3, and the extending portion 3 in the present embodiment is preferably provided without any outlet unit. The third case 31 has a first end and an opposite second end, and the first end and the second end are respectively and perpendicularly connected to the first case 12 and the second case 22. Specifically, the first end of the third case 31 (i.e., the bottom end of the third case 31 as shown in FIG. 3) is integrally connected to the first case 12, and the second end of the third case 31 (i.e., the top end of the third case 31 as shown in FIG. 3) is integrally connected to the second case 22.

The length of the first case 12 in the present embodiment is substantially equal to that of the second case 22. The first case 12, the second case 22, and the third case 31 jointly define a U-shaped hanging slot O. Moreover, the width W' of the first case 12 is substantially equal to the width W" of the second case 22, and the width W of the third case 31 is smaller than the width W' of the first case 12.

In addition, a corner of the first case 12 (i.e., the right-lower corner of the first case 12 as shown in FIG. 2) arranged distant from the third case 31 has a notch 121, and the power cord 4 is rotatable to be arranged in the notch 121 of the first case 12, so that a user can conveniently adjust the position of the power cord 4.

It should be noted that the terms "first", "second", and "third" in the present embodiment are used to distinguish different components from each other and do not have physical meanings, in other words, the terms "first", "second", and "third" in the present embodiment can be omitted. For example, the first outlet unit 11 or the second outlet unit 21 can be named as an outlet unit.

Second Embodiment

Figure 5:
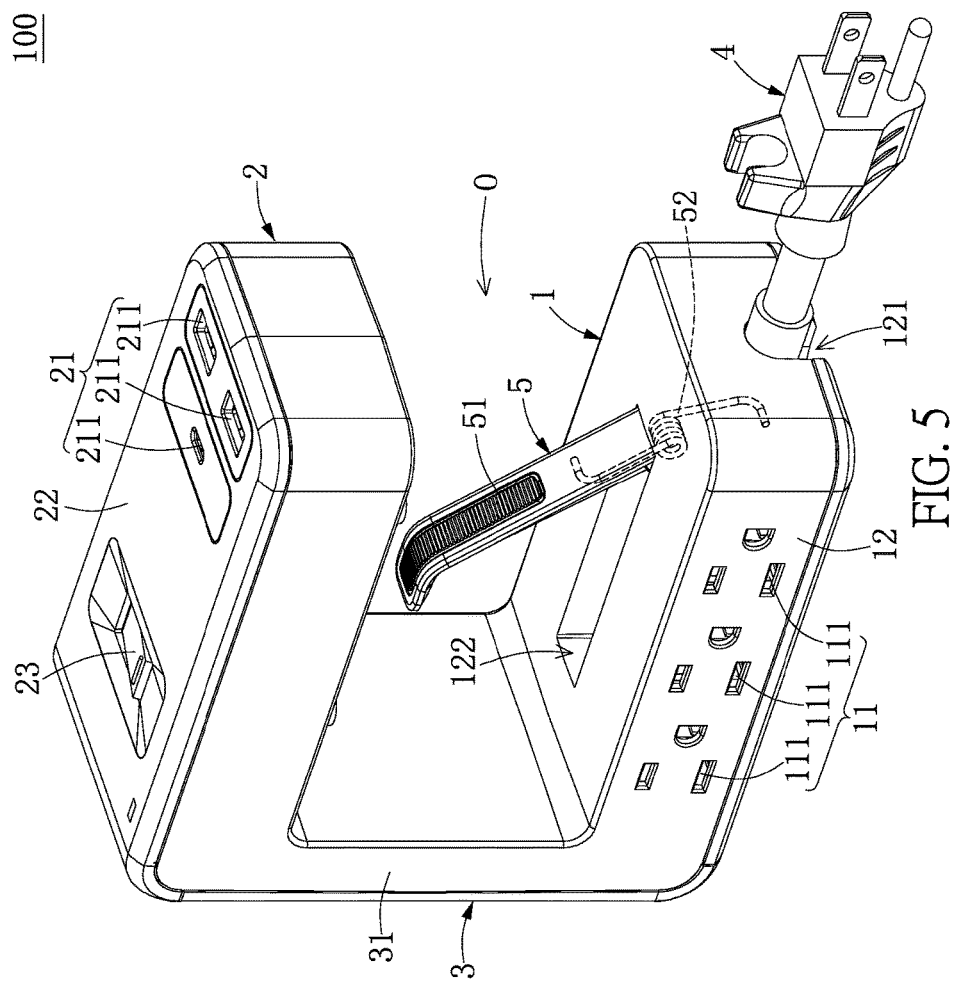
FIG. 5 is a perspective view showing the outlet device according to a second embodiment of the present disclosure.
Figure 6:
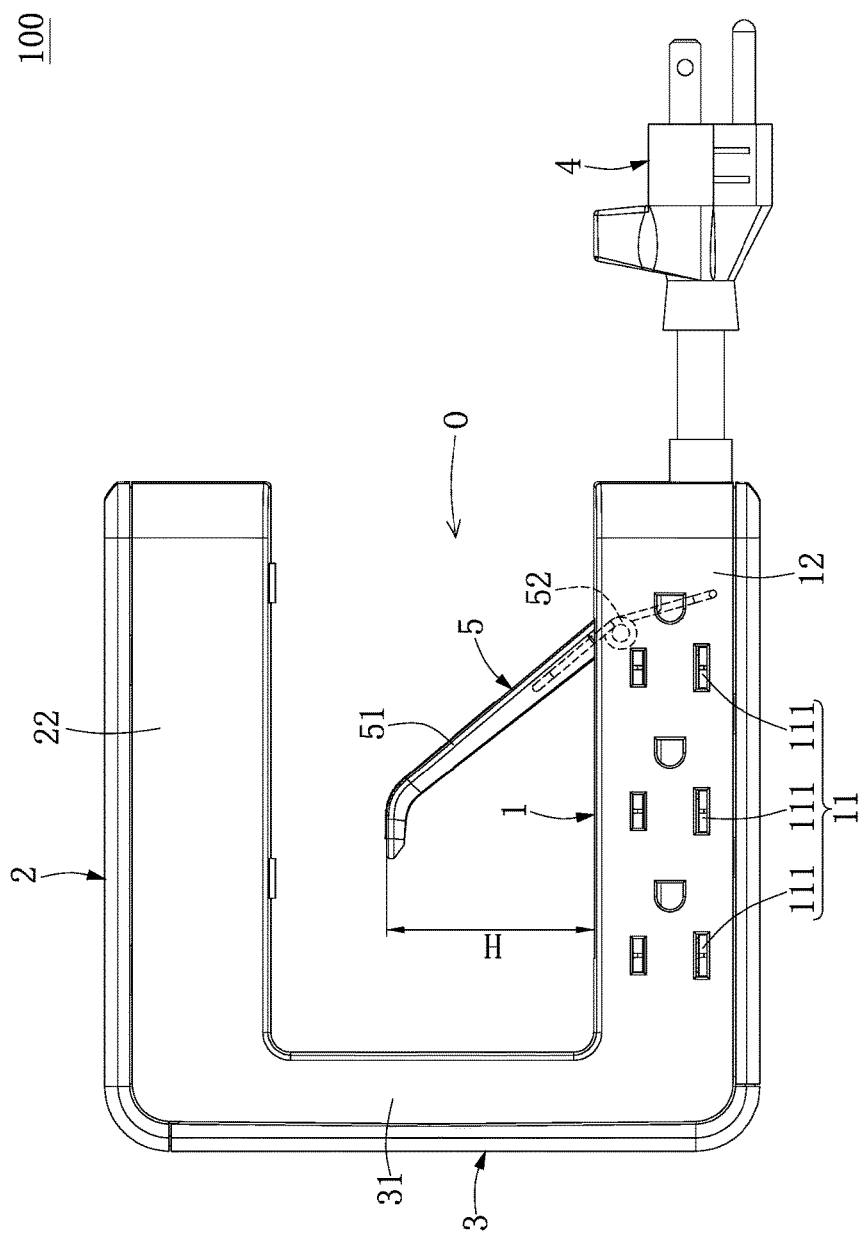
FIG. 6 is a planar view of FIG. 5.
Figure 7:
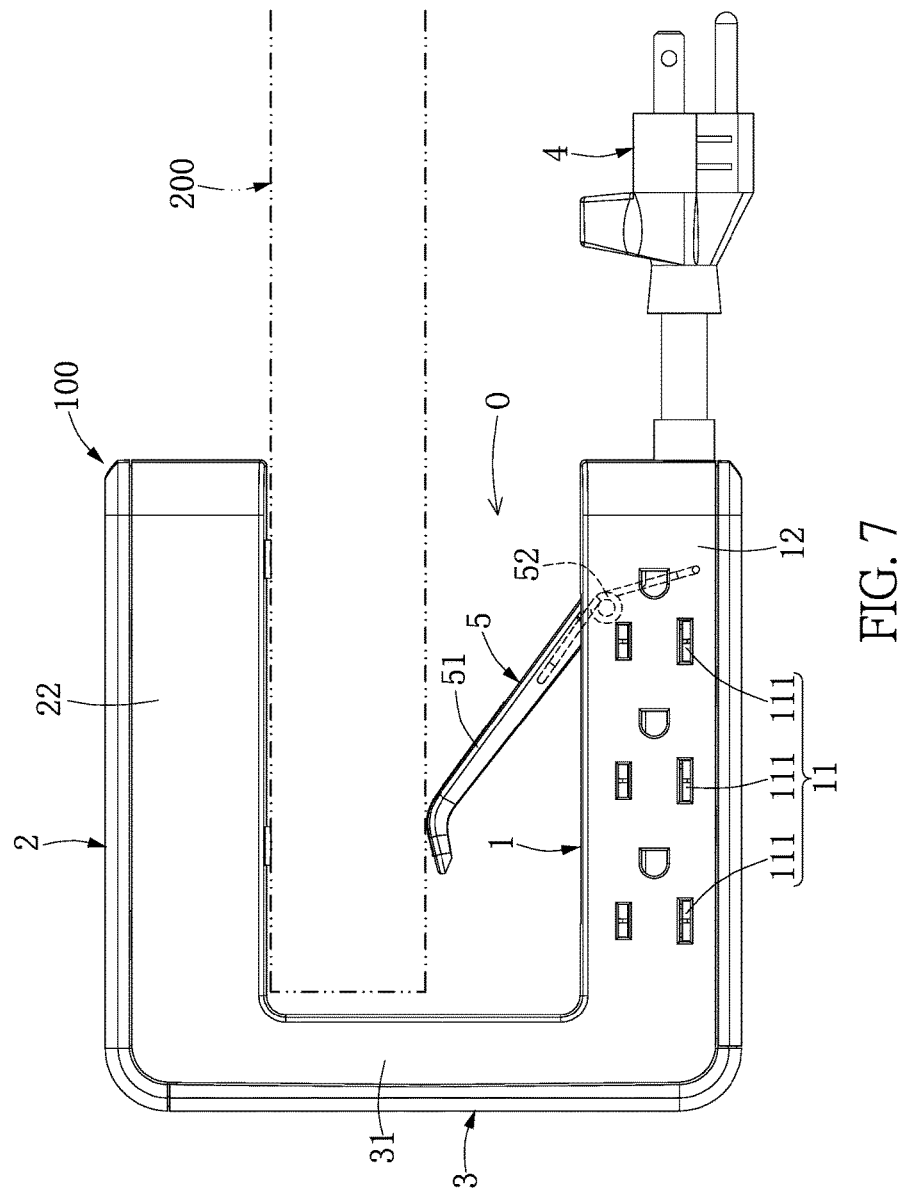
FIG. 7 is a planar view showing the outlet device of FIG. 5 hanging on a plate.

Reference is made to FIGS. 5 to 7, which illustrate a second embodiment of the present disclosure. The difference between the second embodiment and the first embodiment is disclosed as follows.

The outlet device 100 of the present embodiment further includes a limiting structure 5 movably disposed on the first case 12. The limiting structure 5 is arranged in the U-shaped hanging slot O for abutting against the plate 200. The following description discloses the features of the limiting structure 5, but the present disclosure is not limited thereto.

The limiting structure 5 includes an abutting member 51 and an elastic member 52 (i.e., a torsion spring). An end of the abutting member 51 (i.e., the bottom end of the abutting member 51 as shown in FIG. 6) is disposed on (i.e., pivotally connected to) the first case 12 by cooperating with the elastic member 52, and an opposite end of the abutting member 51 (i.e., the top end of the abutting member 51 as shown in FIG. 6) is arranged away from the first case 12 by a vertical distance H. Specifically, a distance between the abutting member 51 and the first case 12 is gradually increased in a direction from bottom to top (i.e., a direction from right side to left side as shown in FIG. 6), and the vertical distance H is the maximum distance between the abutting member 51 and the first case 12.

Moreover, an accommodating slot 122 is recessed in an inner surface of the first case 12 (i.e., a surface of the first case 12 faces the second case 22) and is in air communication with the U-shaped hanging slot O. The accommodating slot 122 is configured to receive the limiting structure 5, and the abutting member 51 of the limiting structure 5 is movable toward (or movable into) the accommodating slot 122 when being pressed.

In more detail, when the abutting member 51 is pressed to cause reduction of the vertical distance H, that is to say, the top end of the abutting member 51 as shown in FIG. 7 moves toward the accommodating slot 122, the elastic member 52 stores an elastic force tending to recover the vertical distance H, so that the abutting member 51 can abut against the plate 200 by the elastic force generated from the elastic member 52.

Third Embodiment

Reference is made to FIGS. 8 to 12, which illustrate a third embodiment of the present disclosure. The difference between the third embodiment and the first embodiment is disclosed as follows.

Figure 8:
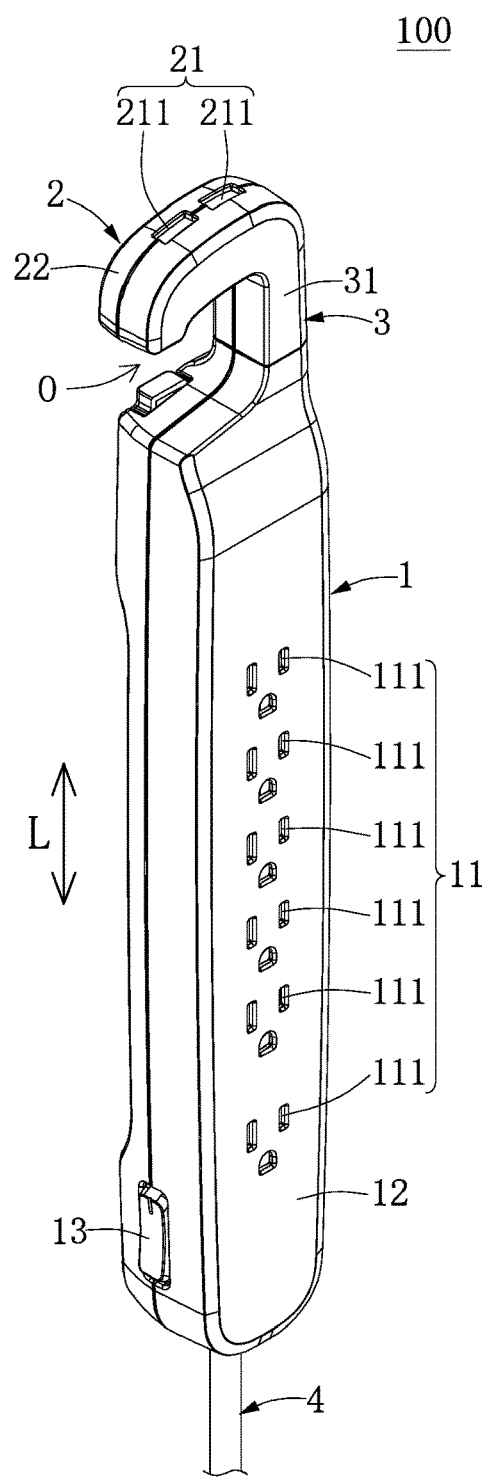
FIG. 8 is a perspective view showing the outlet device according to a third embodiment of the present disclosure.
Figure 9:
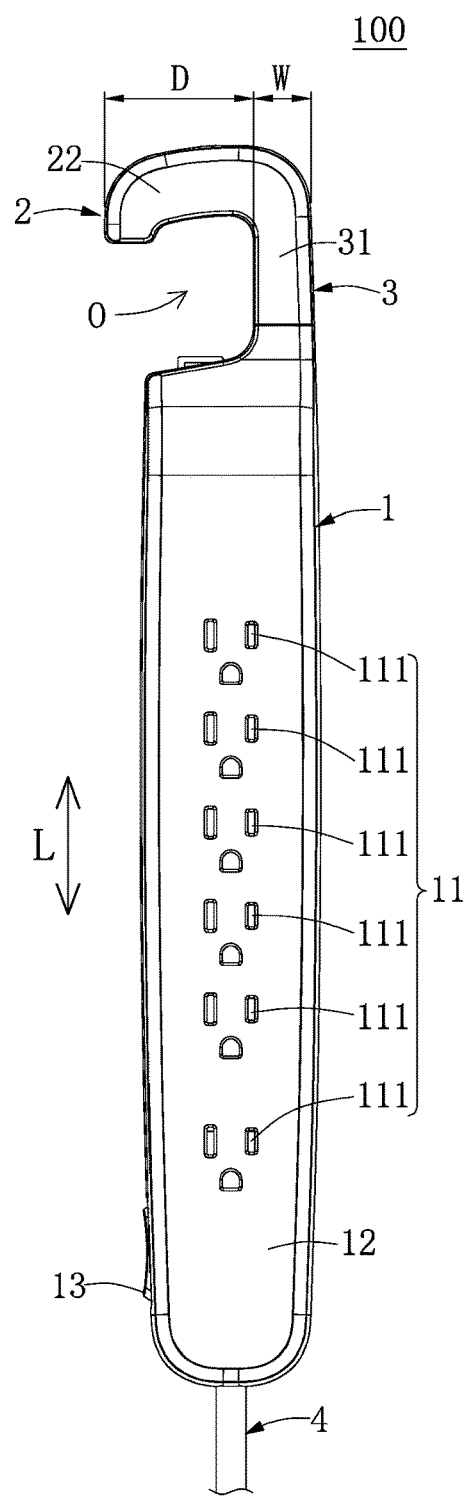
FIG. 9 is a planar view of FIG. 8.
Figure 10:
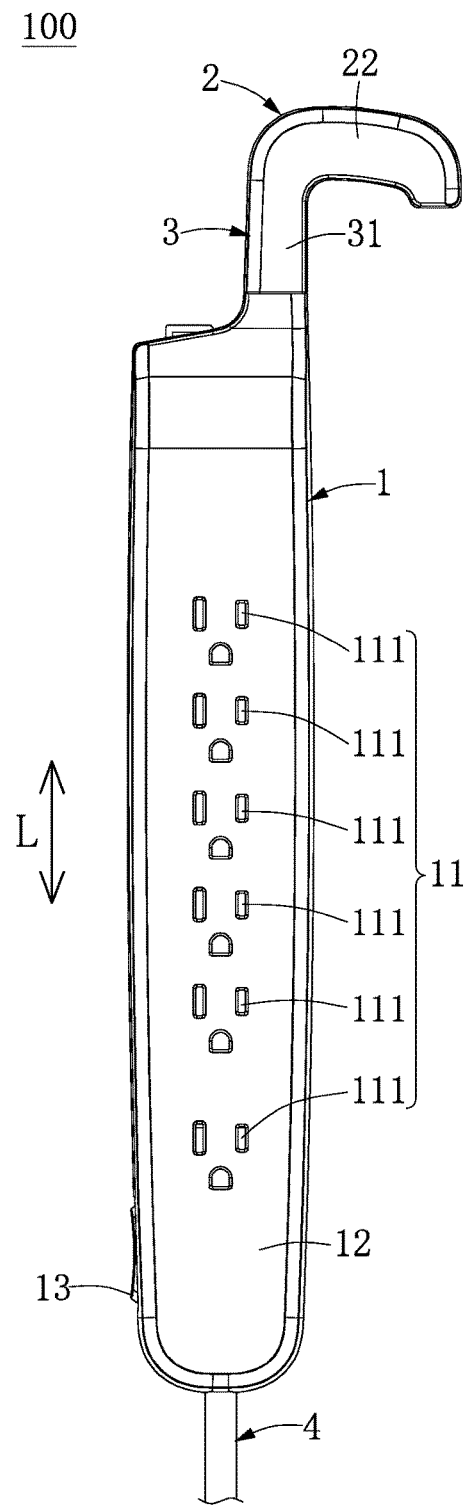
FIG. 10 is a planar view showing that the counterweight portion and the extending portion of FIG. 8 are rotatable relative to each other.
Figure 11:
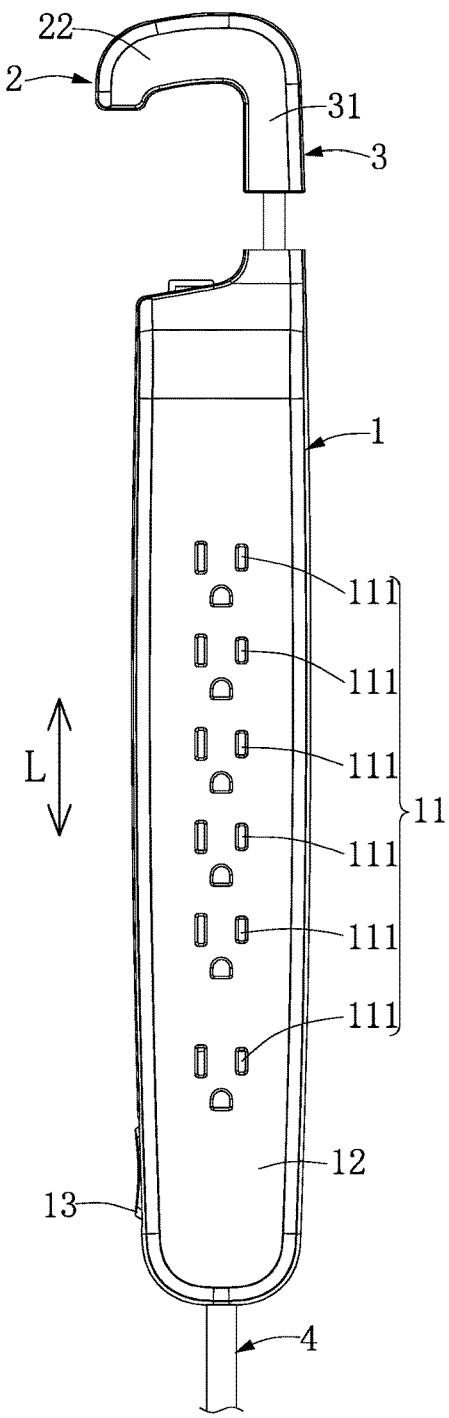
FIG. 11 is a planar view showing that the counterweight portion and the extending portion of FIG. 8 are retractable relative to each other.
Figure 12:
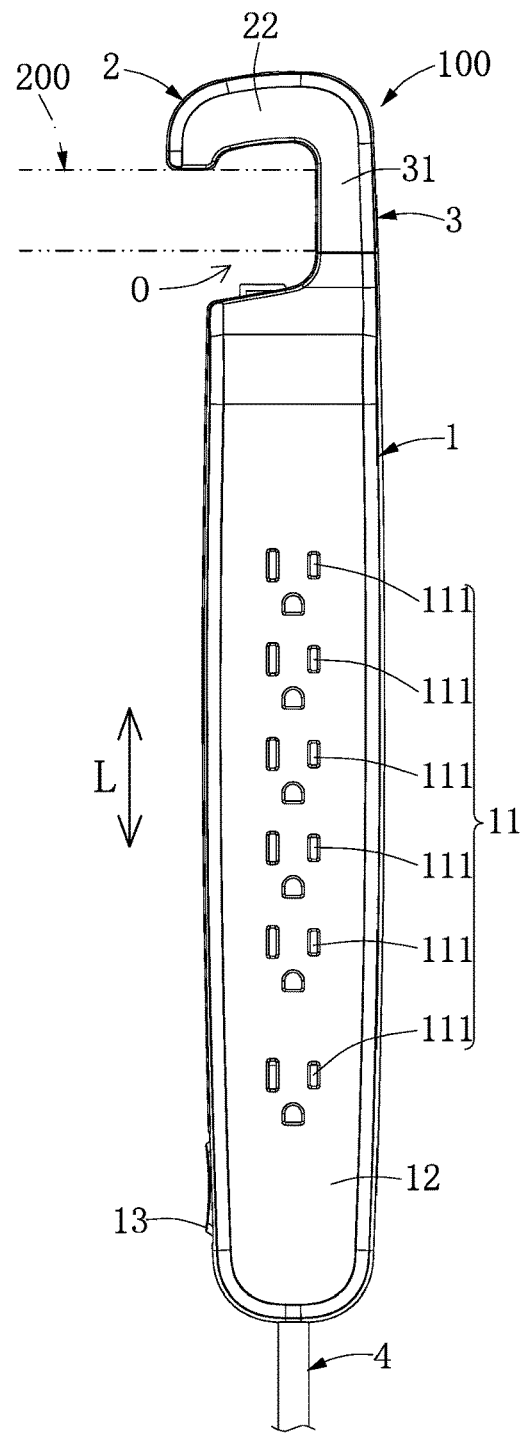
FIG. 12 is a planar view showing the outlet device of FIG. 8 hanging on a plate.

In the present embodiment, the first case 12 having an elongated shape defines a longitudinal direction L, which is perpendicular to the lateral direction D and the width W. The first end of the third case 31 (i.e., the bottom end of the third case 31 as shown in FIGS. 8 and 9) is movably connected to the first case 12, and the second end of the third case 31 (i.e., the top end of the third case 31 as shown in FIGS. 8 and 9) is integrally connected to the second case 22. Moreover, the connection of the first end of the third case 31 and the first case 12 in the present embodiment can be, but is not limited to, a rotatable connection as shown in FIG. 10 or a retractable connection as shown in FIG. 11.

Specifically, the first outlet unit 11 includes a plurality of AC power outlets 111 arranged in one row parallel to the longitudinal direction L. The counterweight portion 1 has a switch unit 13 disposed on a bottom of the first case 12 for controlling the first outlet unit 11 and/or the second outlet unit 21 to supply electricity. The hanging portion 2 in the present embodiment is provided without any switch unit. Moreover, the power cord 4 is connected to an end of the counterweight portion 1 (i.e., the bottom end of the first case 12 as shown in FIG. 9) arranged distant from the hanging portion 2.

Fourth Embodiment

Figure 13:
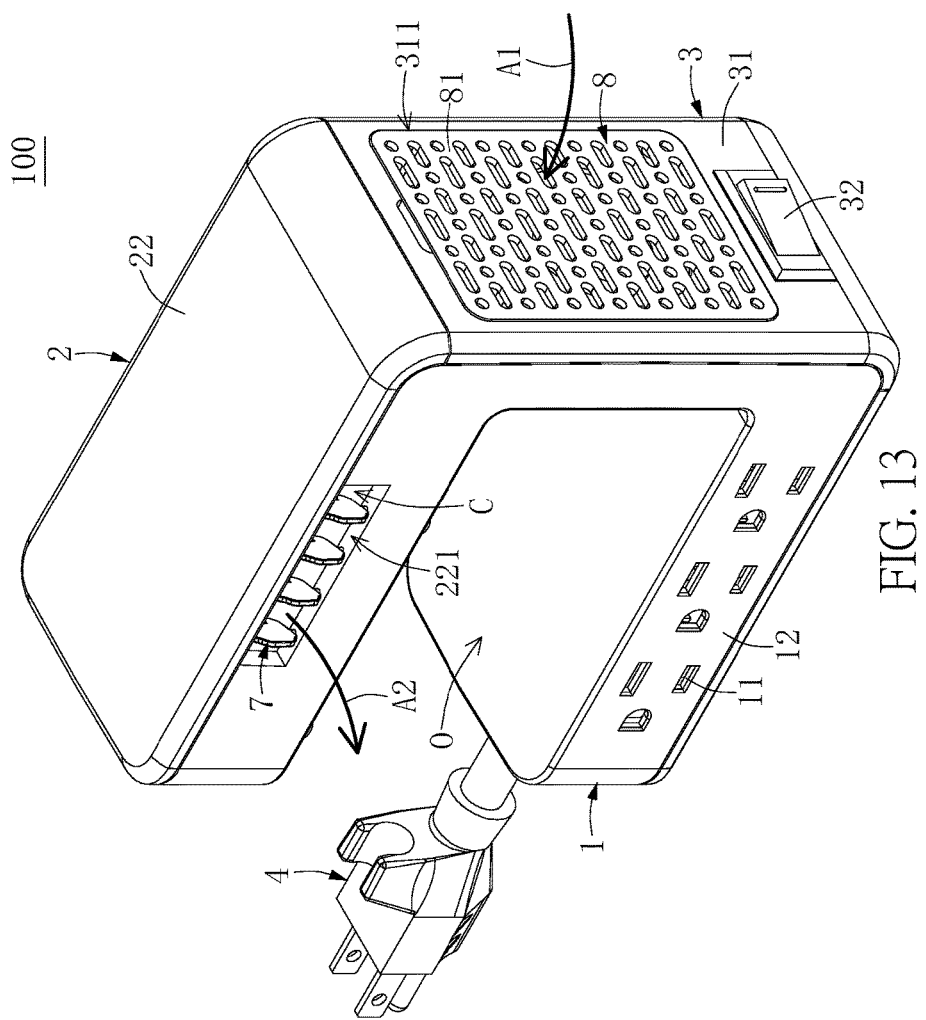
FIG. 13 is a perspective view showing the outlet device according to a fourth embodiment of the present disclosure.
Figure 14A:
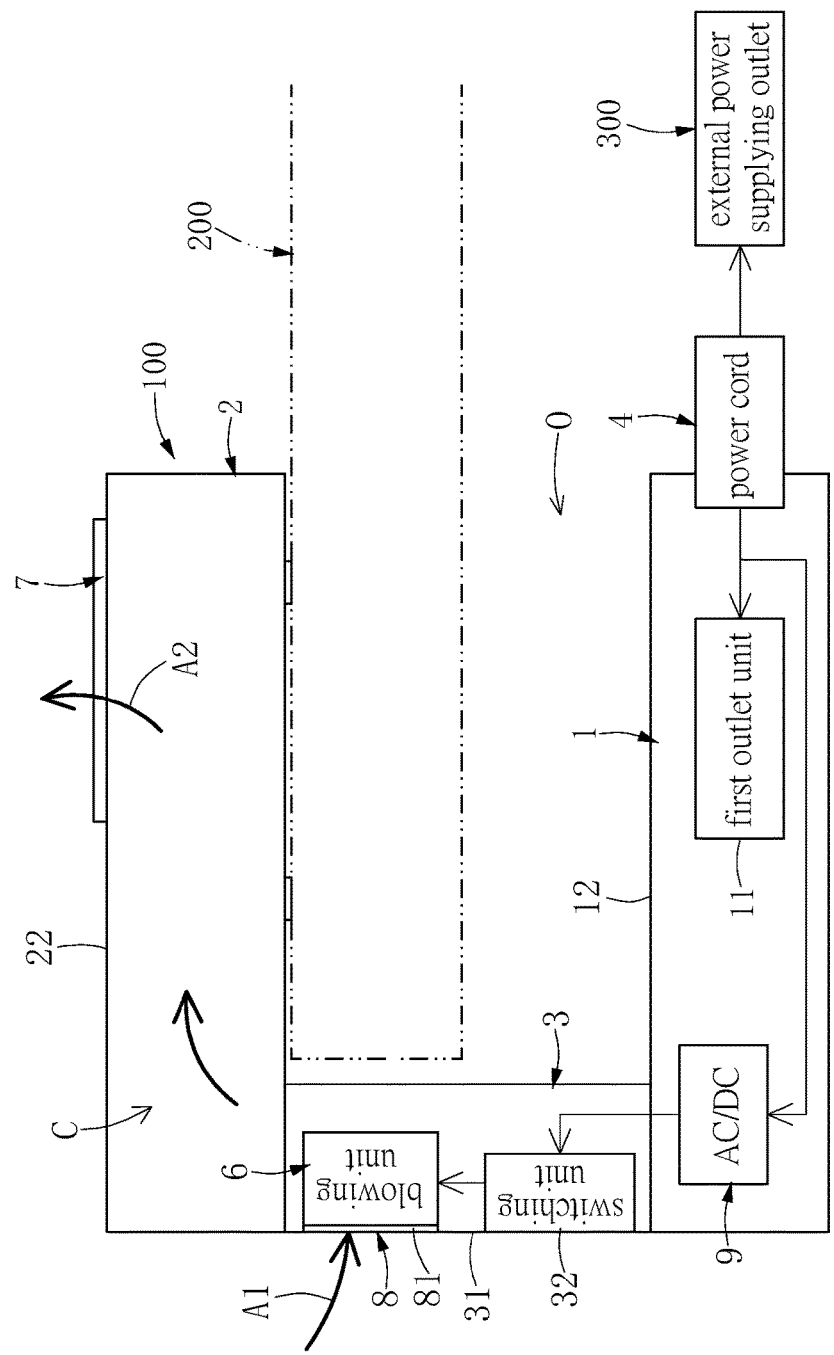
FIG. 14A is a first schematic view of FIG. 13.
Figure 14B:
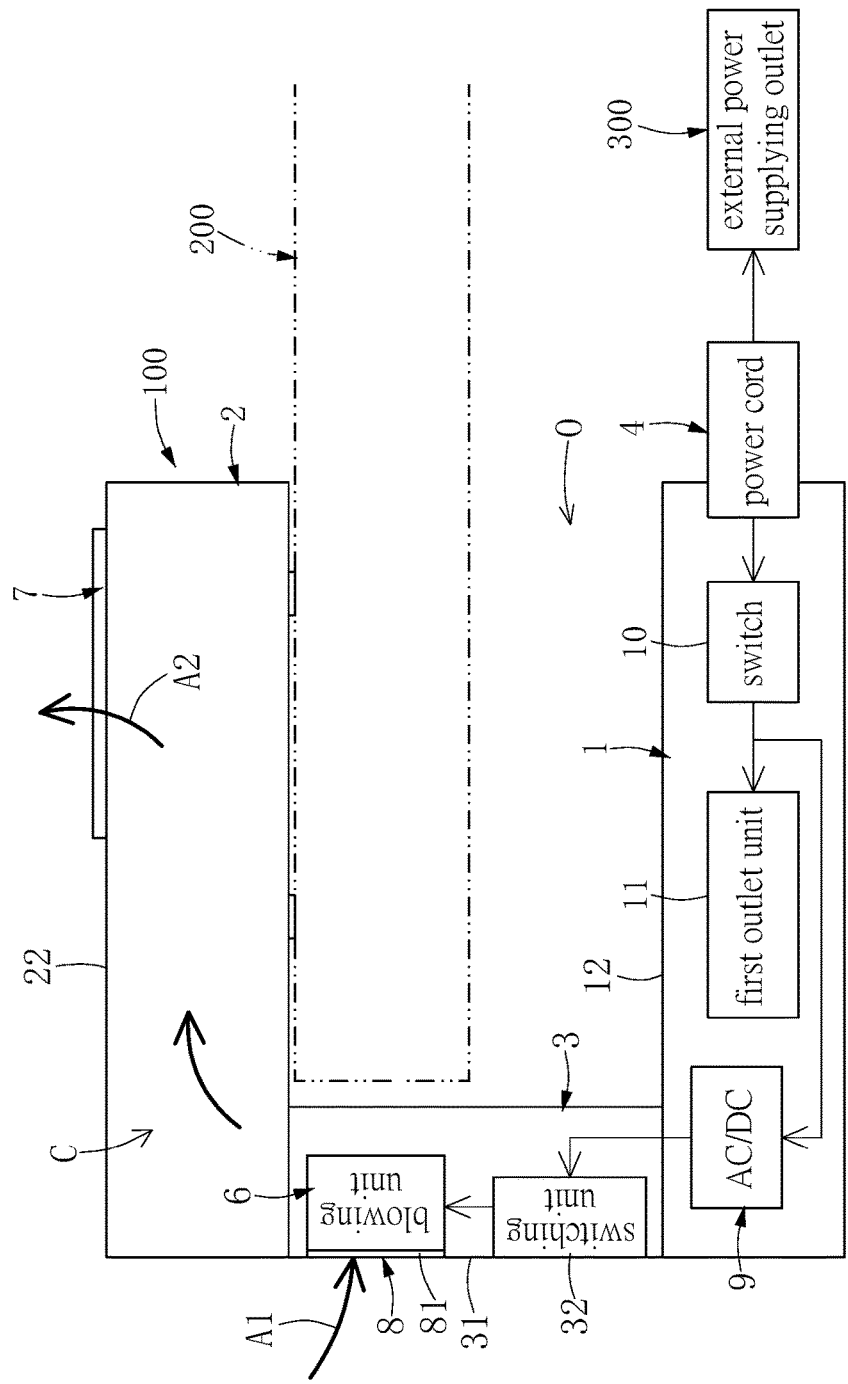
FIG. 14B is a second schematic view of FIG. 13.

Reference is made to FIGS. 13 to 14B, which illustrate a fourth embodiment of the present disclosure. The difference between the fourth embodiment and the above embodiments is disclosed as follows.

The outlet device 100 in the present embodiment can be provided with an outlet unit arranged on at least one of the counterweight portion 1 and the hanging portion 2. The figures of the present embodiment show the outlet unit 11 arranged on the counterweight portion 1, but the present disclosure is not limited thereto. Moreover, the structures and the corresponding members of the counterweight portion 1, the hanging portion 2, and the extending portion 3 in the present disclosure can be interchanged or adjusted according to designer demands.

An airflow channel C is formed in the extending portion 3, the hanging portion 2, and the counterweight portion 1. Specifically, the first case 12 of the counterweight portion 1, the second case 22 of the hanging portion 2, and the third case 31 of the extending portion 3 are formed with the airflow channel C, an air exit 221, and an air entrance 311. The air exit 221 and the air entrance 311 are in air communication with the airflow channel C, and the air exit 221 and the air entrance 311 are not limited to be located at two opposite ends of the airflow channel C.

The inner space of the first case 12, the second case 22, and the third case 31 in the present embodiment is defined as the airflow channel C, that it to say, the airflow channel C is not formed by using an additional member, but the present disclosure is not limited thereto. In other embodiments of the present disclosure, the first case 12, the second case 22, and the third case 31 can be provided with a partition or a tube to form the airflow channel C.

In the present embodiment, the air entrance 311 is arranged on the third case 31 of the extending portion 3, the air exit 221 is arranged on the second case 22 of the hanging portion 2, and the air exit 221 and the air entrance 311 are both arranged outside the U-shaped hanging slot O, but the present disclosure is not limited thereto.

As shown in FIGS. 13 and 14A, the outlet device 100 further includes a blowing unit 6, a guiding blade 7, an air transforming unit 8, and an AC/DC convertor 9. The blowing unit 6 and the air transforming unit 8 are arranged in the airflow channel C. The blowing unit 6 is configured to inhale external air A1 into the airflow channel C and blow airflow A2 to the air exit 221. The air transforming unit 8 is configured to transform the original property of the external air A1, so that the original property of the airflow A2 passed the air transforming unit 8 is different from that of the external air A1. In other embodiments of the present disclosure, the guiding blade 7 and the air transforming unit 8 can be omitted.

Moreover, the outlet device 100 in the present embodiment can further include a switch 10 (as shown in FIG. 14B). The switch 10 is electrically connected to the power cord 4, the outlet unit 11, and the AC/DC convertor 9, thereby controlling the function of supplying power of the outlet device 100, but the present disclosure is not limited thereto. For example, in other embodiments of the present disclosure, if the power cord 4 is replaced by other components (e.g., plug terminals), the switch 10 can be omitted.

Specifically, the blowing unit 6 can be a fan or an air pump, but the present disclosure is not limited thereto. The blowing unit 6 is corresponding in position to the air entrance 311 and is arranged outside the U-shaped hanging slot O. The blowing unit 6 in the present embodiment is fixed on the third case 31 and is arranged adjacent to the air entrance 311, and at least part of the blowing unit 6 is arranged outside the third case 31 through the air entrance 311, but the present disclosure is not limited thereto. In other embodiments of the present disclosure, the blowing unit 6 fixed in the third case 31 can be arranged away from the air entrance 311.

The guiding blade 7 is arranged at the air exit 221 of the second case 2. The guiding blade 7 in the present embodiment is pivotally connected to the second case 22, and the guiding blade 7 is rotatable relative to the second case 22 for adjusting the direction of the airflow A2.

The air transforming unit 8 is arranged on the second case 2 and is corresponding in position to the airflow channel C. The air transforming unit 8 is configured to transform the original property of the external air A1, so that the original property of the airflow A2 passed the air transforming unit 8 is different from that of the external air A1. Specifically, the air transforming unit 8 can be an air filtering member (e.g., a filter, an electrostatic dust module, an UV lamp module, an anion generator module, an ozone generation module, or other members).

In order to clearly show the present embodiment, the air filtering member in the following description employs a filter 81 as an exemplary example, but the present disclosure is not limited thereto. The filter 81 is detachably installed in the air entrance 311 to shield the blowing unit 6, so that the external air A1 inhaled by the blowing unit 6 can be filtered by passing through the filter 81. Accordingly, the airflow A2 is cleaner than the external air A1.

It should be noted that the air entrance 311 in the present embodiment is preferably corresponding in shape to the filter 81, so that the filter 81 can be firmly wedged in the air entrance 311 of the third case 31. The material of the filter 81 can be changed according to designer demands.

An end of the power cord 4 is connected to the counterweight portion 1 and is electrically connected to the outlet unit 11 and the blowing unit 6, and the other end of the power cord 4 is used for detachably inserting into an external power supplying outlet 300. Thus, the power cord 4 can transmit electricity from the external power supplying outlet 300 to the outlet unit 11 and the blowing unit 6. In addition, in other embodiments of the present disclosure, the power cord 4 can be omitted or can be replaced by other components (e.g., plug terminals).

The extending portion 3 can further include a switching unit 32 installed on the third case 31, and a part of the switching unit 32 is exposed from the third case 31 for being triggered by a user. The switching unit 32 is electrically connected to the power cord 4 and the blowing unit 6, thereby controlling the blowing unit 6 to start or stop the operation. In other embodiments of the present disclosure, the switching unit 32 can be arranged between the AC/DC convertor 9 and the power cord 4 (or switch 10), and the AC/DC convertor 9 is electrically connected to the blowing unit 6.

In addition, the AC/DC convertor 9 is arranged between the power cord 4 and the switching unit 32, so that DC electricity converted by the AC/DC convertor 9 can be transmitted to the bowing unit 6 through the switching unit 32. In other embodiments of the present disclosure, if the outlet unit 11 includes a DC power outlet and a corresponding AC/DC convertor, the switching unit 32 and the DC power outlet can be provided to cooperate with the same AC/DC convertor, that is to say, the switching unit 32 can be cooperated with (i.e., electrically connected to) the AC/DC convertor of the outlet unit 11.

In summary, the outlet device 100 is provided with the blowing unit 6 and the air transforming unit 8 which are cooperated with each other, and the inner space of outlet device 100 can be utilized to form the airflow channel C, so that the outlet device 100 can be used to change a surrounding environment close to a user for increasing its value added.

Fifth Embodiment

Figure 15:
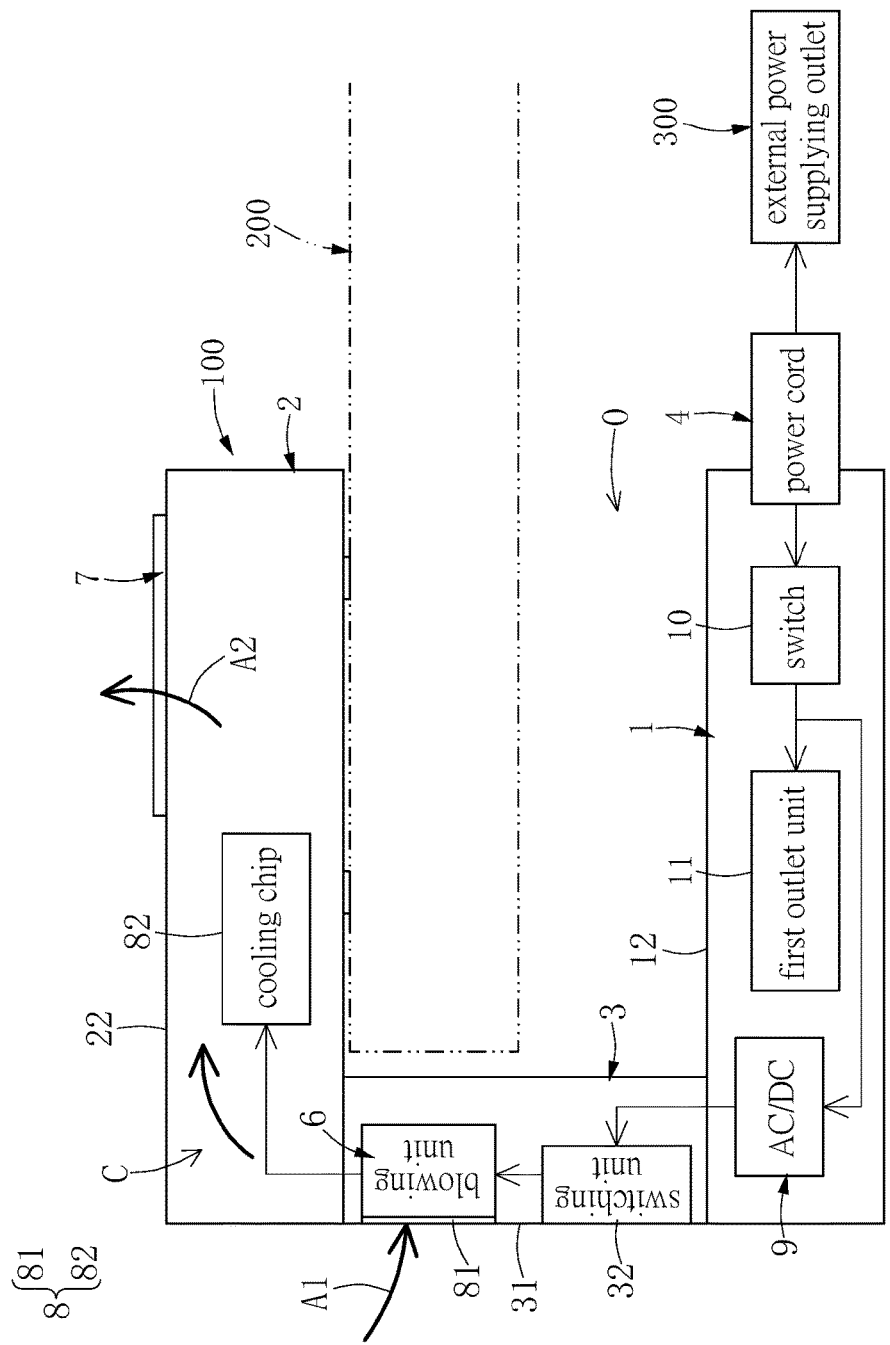
FIG. 15 is a schematic view showing the outlet device according to a fifth embodiment of the present disclosure.

Reference is made to FIG. 15, which illustrates a fifth embodiment of the present disclosure. The difference between the fifth embodiment and the fourth embodiment is disclosed as follows.

The air transforming unit 8 in the present embodiment further includes a cooling chip 82. The switching unit 32 is electrically connected to the outlet unit 11 by the AC/DC convertor 9, and is electrically connected to the air transforming unit 8 (i.e., the cooling chip 82) by the blowing unit 6, so that the blowing unit 6 and the air transforming unit 8 can be controlled to simultaneously start or to simultaneously stop the operation by using the switching unit 32.

Moreover, the cooling chip 82 is arranged in the airflow channel C between the blowing unit 6 and the air exit (i.e., the cooling chip 82 is arranged in the hanging portion 2), so that the external air A1 inhaled by the blowing unit 6 can be cooled by the cooling chip 82. Accordingly, the airflow A2 becomes cooler than the external air A1.

Specifically, in other embodiments of the present disclosure, the outlet device 100 can be provided without the filter 81, the air entrance can be a plurality of thru-holes formed on the third case 31, and the blowing unit 6 is arranged in the third case 31 adjacent to the thru-holes. In addition, the outlet device 100 can be provided without the guiding blade 7.

Sixth Embodiment

Figure 16:
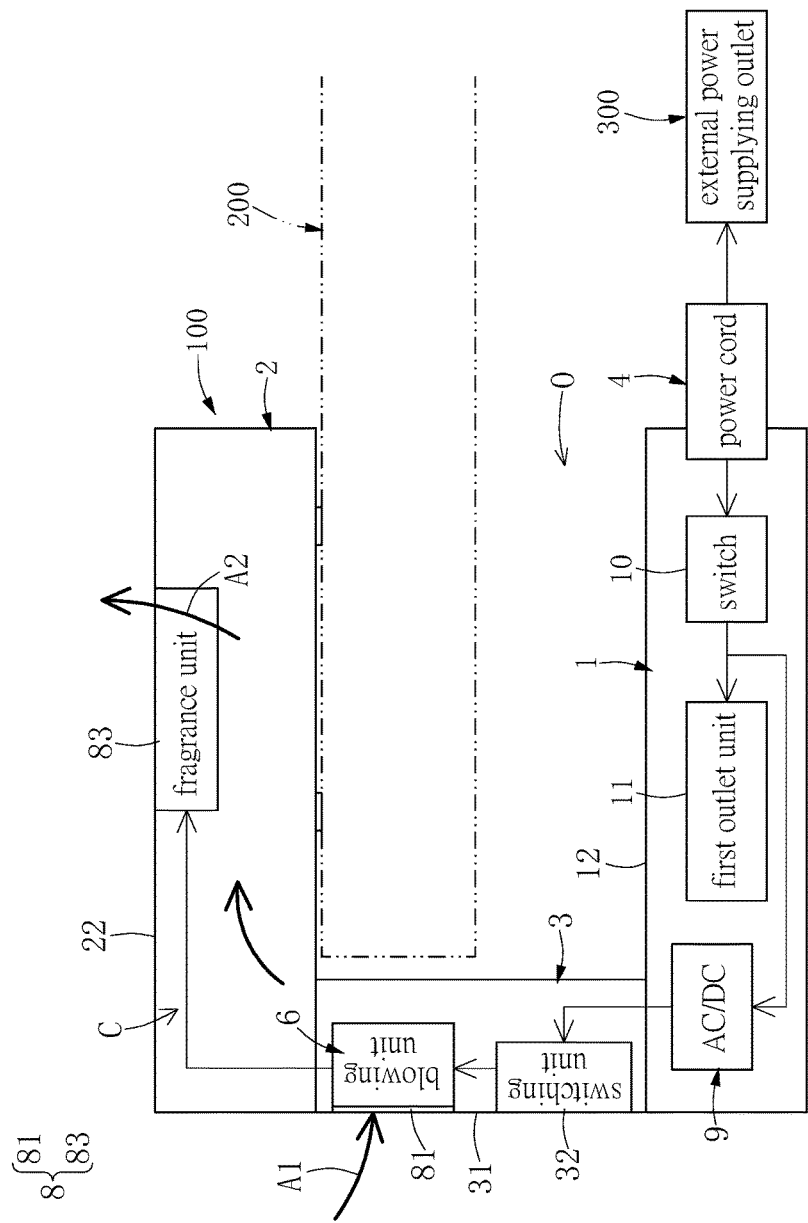
FIG. 16 is a schematic view showing the outlet device according to a sixth embodiment of the present disclosure.

Reference is made to FIG. 16, which illustrates a sixth embodiment of the present disclosure. The difference between the sixth embodiment and the fourth embodiment is disclosed as follows.

The air transforming unit 8 in the present embodiment further includes a fragrance unit 83. The switching unit 32 is electrically connected to the outlet unit 11 by the AC/DC convertor 9, and is electrically connected to the air transforming unit 8 (i.e., the fragrance unit 83) by the blowing unit 6, so that the blowing unit 6 and the air transforming unit 8 can be controlled to simultaneously start or to simultaneously stop the operation by using the switching unit 32. The fragrance unit 83 in the present embodiment can be provided with a heating member (not shown), and the essential oil of the fragrance unit 83 can be heated to volatilize by using the heating member.

Moreover, the fragrance unit 83 is arranged in the air exit (not shown) for mixing the volatilized essential oil into the external air A1 inhaled by the blowing unit 6, so that the airflow A2 can be more fragrant than the external air A1. In other words, the fragrance unit 83 in the present embodiment is cooperated with the blowing unit 6, and the fragrance unit 83 does not have any blowing member. Moreover, the structure of the fragrance unit 83 can be changed according to designer demands.

In addition, in other embodiments of the present disclosure, the air transforming unit 8 of the outlet device 100 can include at least one of the air filtering member (e.g., the filter 81), the cooling chip 82, and the fragrance unit 83.

The Effects of the Embodiments

In summary, the outlet device of the first to third embodiments of the present disclosure can satisfy a condition where an outlet on the plate and an outlet under the plate are needed at the same time by disposing the hanging portion on the plate to provide the first outlet unit under the plate and the second outlet unit above the plate.

Moreover, the outlet device of the present disclosure can be firmly hung on a plate which may have different thicknesses, by forming the limiting structure in the U-shaped hanging slot and using the limiting structure to abut against the plate.

In addition, the connection of the extending portion and the counterweight portion can be a movable connection, so that the outlet device of the present disclosure can be applied to different usage environments and can satisfy user needs.

The outlet device of the fourth to sixth embodiments of the present disclosure is provided with the blowing unit, and the inner space of outlet device can be utilized to form the airflow channel, so that the value added of the outlet device can be increased. Moreover, the blowing unit and the air transforming unit of the outlet device can be cooperated with each other to change a surrounding environment close to a user for increasing its value added.

In addition, the outlet device can be provided with the guiding blade arranged in the air exit, so that when the outlet device is located at different positions, the airflow from the outlet device can be guided to flow toward a user by adjusting the guiding blade.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An outlet device for being hung on a plate, comprising:
   a counterweight portion including an outlet unit;
   a hanging portion arranged distant from the counterweight portion;
   an extending portion having two opposite ends respectively connected to the counterweight portion and the hanging portion, wherein the extending portion, the hanging portion, and the counterweight portion are formed with an airflow channel, an air exit, and an air entrance, wherein the air exit and the air entrance are in air communication with the airflow channel, wherein a free end of the hanging portion is arranged distant from the extending portion by a lateral distance, the extending portion has a width parallel to the lateral distance, and the width is less than or equal to the lateral distance;
   a blowing unit corresponding in position to the air entrance, wherein the blowing unit is configured to inhale external air into the extending portion and blow airflow to the air exit through the airflow channel; and
   a power cord electrically connected to the outlet unit and the blowing unit, wherein the power cord has an end connected to the counterweight portion and an opposite end used for detachably inserting into an external power supplying outlet,
   wherein when the outlet device is applied to the plate, the counterweight portion is arranged under the plate and the hanging portion is arranged on the plate, and the hanging portion remains hung on the plate by a weight distribution of the outlet device, thereby maintaining the outlet device in a static balance state,
   wherein the counterweight portion includes a first case, the outlet unit is disposed in the first case, the hanging portion includes a second case, the air exit is arranged on the second case, the extending portion includes a third case and a switching unit installed on the third case, the air entrance is arranged on the third case, the blowing unit is fixed on the third case and is arranged adjacent to the air entrance, the switching unit is electrically connected to the power cord and the blowing unit, and a part of the switching unit is exposed from the third case for being triggered to start or stop the blowing unit by a user,
   wherein the third case has a first end and an opposite second end, and the first end and the second end are respectively and perpendicularly connected to the first case and the second case.

2. The outlet device as claimed in claim 1, wherein the first end and the second end of the third case are integrally connected to the first case and the second case respectively, and the first case, the second case, and the third case jointly form a U-shaped hanging slot for receiving a part of the plate, wherein the air exit, the air entrance, and the blowing unit are arranged outside the U-shaped hanging slot.

3. The outlet device as claimed in claim 1, further comprising a guiding blade arranged at the air exit, wherein the guiding blade is pivotally connected to the second case, and the guiding blade is rotatable relative to the second case for adjusting the direction of the airflow.

4. The outlet device as claimed in claim 1, further comprising an air transforming unit corresponding in position to the airflow channel, wherein the air transforming unit is configured to transform the original property of the external air, so that the original property of the airflow passed the air transforming unit is different from that of the external air.

5. The outlet device as claimed in claim 4, wherein the air transforming unit includes at least one of an air filtering member, a cooling chip, and a fragrance unit.

6. An outlet device for being hung on a plate, comprising:
   a counterweight portion;
   a hanging portion arranged distant from the counterweight portion, wherein at least one of the counterweight portion and the hanging portion is provided with an outlet unit;
   an extending portion having two opposite ends respectively connected to the counterweight portion and the hanging portion, wherein the extending portion, the hanging portion, and the counterweight portion are formed with an airflow channel and an air exit in air communication with the airflow channel; and
   a blowing unit arranged in the airflow channel, wherein the blowing unit is configured to inhale external air into the airflow channel and blow airflow to the air exit,
   wherein when the outlet device is applied to the plate, the counterweight portion is arranged under the plate and the hanging portion is arranged on the plate, and the hanging portion remains hung on the plate by a weight distribution of the outlet device, thereby maintaining the outlet device in a static balance state,
   wherein the counterweight portion includes a first case, the outlet unit is disposed in the first case, the hanging portion includes a second case, the air exit is arranged on the second case, the extending portion includes a third case and a switching unit installed on the third case, the air entrance is arranged on the third case, the blowing unit is fixed on the connected to the power cord and the blowing unit, and a part of the switching unit is exposed from the third case for being triggered to start or stop the blowing unit by a user, wherein the third case has a first end and an opposite second end, and the first end and the second end are respectively and perpendicularly connected to the first case and the second case.

7. The outlet device as claimed in claim 6, wherein a free end of the hanging portion is arranged distant from the extending portion by a lateral distance, the extending portion has a width parallel to the lateral distance, and the width is less than or equal to the lateral distance.

8. The outlet device as claimed in claim 6, further comprising an air transforming unit corresponding in position to the airflow channel, wherein the air transforming unit is configured to transform the original property of the external air, so that the original property of the airflow passed the air transforming unit is different from that of the external air.

9. The outlet device as claimed in claim 8, wherein the air transforming unit includes at least one of an air filtering member, a cooling chip, and a fragrance unit.

* * * * *